(12) United States Patent
Chandler et al.

(10) Patent No.: US 10,770,262 B1
(45) Date of Patent: Sep. 8, 2020

(54) APPARATUS, METHOD AND SYSTEM FOR IMAGING AND UTILIZATION OF SEM CHARGED PARTICLES

(71) Applicant: National Technology & Engineering Solutions of Sandia, LLC, Albuquerque, NM (US)

(72) Inventors: David W. Chandler, Livermore, CA (US); Kimberlee Chiyoko Celio, Berkeley, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/198,356

(22) Filed: Nov. 21, 2018

Related U.S. Application Data

(60) Provisional application No. 62/678,011, filed on May 30, 2018.

(51) Int. Cl.
*H01J 37/244* (2006.01)
*H01J 37/12* (2006.01)
(Continued)

(52) U.S. Cl.
CPC ............ *H01J 37/244* (2013.01); *H01J 37/06* (2013.01); *H01J 37/12* (2013.01); *H01J 37/20* (2013.01);
(Continued)

(58) Field of Classification Search
CPC .......... H01J 37/244; H01J 37/06; H01J 37/12; H01J 37/20; H01J 37/22; H01J 37/28;
(Continued)

(56) References Cited

U.S. PATENT DOCUMENTS

| | | | | |
|---|---|---|---|---|
| 5,138,169 A | * | 8/1992 | Yamazaki | ............. H01J 37/026 250/398 |
| 5,872,358 A | * | 2/1999 | Todokoro | ............. H01J 37/145 250/310 |

(Continued)

OTHER PUBLICATIONS

Jacka, M., et al. "A Fast, Parallel Acquisition, Electron Energy Analyzer: The Hyperbolic Field Analyzer." Review of Scientific Instruments, vol. 70, No. 5, 1999, pp. 2282-2287.

*Primary Examiner* — Nicole M Ippolito
*Assistant Examiner* — Sean M Luck
(74) *Attorney, Agent, or Firm* — Medley, Behrens & Lewis, LLC

(57) ABSTRACT

A scanning electron microscope (SEM) system includes an SEM objective that emits an electron beam toward a sample, causing emission of charged particles including secondary electrons, Auger electrons, backscattered electrons, anions and cations. The SEM system includes electron optics elements that are configured to establish electric fields around the sample that accelerate charged particles toward a detector. A two-dimensional distribution of locations of incidence of the charged particles on the detector is indicative of energies of the charged particles and their emission angles from the sample. A three-dimensional spatial distribution of charged particles emitted from the sample is recovered by performing an Abel transform over the distribution on the detector. The energies and emission angles of the charged particles are then determined from the three-dimensional spatial distribution.

19 Claims, 7 Drawing Sheets

(51) Int. Cl.
*H01J 37/06* (2006.01)
*H01J 37/28* (2006.01)
*H01J 37/22* (2006.01)
*H01J 37/20* (2006.01)

(52) U.S. Cl.
CPC .............. *H01J 37/22* (2013.01); *H01J 37/28* (2013.01); *H01J 2237/04735* (2013.01); *H01J 2237/2443* (2013.01); *H01J 2237/24585* (2013.01)

(58) Field of Classification Search
CPC ..... H01J 2237/04735; H01J 2237/2443; H01J 2237/24585; H01J 2237/05; H01J 2237/053; H01J 2237/0535; H01J 2237/057
See application file for complete search history.

(56) References Cited

U.S. PATENT DOCUMENTS

| | | | |
|---|---|---|---|
| 6,066,849 A * | 5/2000 | Masnaghetti | H01J 37/28 250/310 |
| 6,444,981 B1 * | 9/2002 | Todokoro | H01J 37/28 250/306 |
| 6,512,228 B2 * | 1/2003 | Todokoro | H01J 37/28 250/306 |
| 6,661,008 B2 * | 12/2003 | Takagi | G01N 23/2251 250/305 |
| 7,276,694 B1 * | 10/2007 | Bertsche | H01J 37/244 250/305 |
| 7,294,835 B2 * | 11/2007 | Todokoro | G01N 23/225 250/310 |
| 7,714,287 B1 * | 5/2010 | James | H01J 37/1472 250/306 |
| 7,928,381 B1 * | 4/2011 | Kelly | H01J 37/05 250/305 |
| 7,947,951 B2 * | 5/2011 | Khursheed | H01J 37/05 250/305 |
| 8,729,466 B1 * | 5/2014 | Mankos | H01J 37/026 250/305 |
| 9,048,063 B1 * | 6/2015 | Ren | H01J 37/12 |
| 2002/0117635 A1 * | 8/2002 | Shinada | G01N 23/225 250/492.3 |
| 2002/0148960 A1 * | 10/2002 | Todokoro | H01J 37/28 250/310 |
| 2007/0221846 A1 * | 9/2007 | Todokoro | G01N 23/225 250/310 |
| 2008/0223522 A1 * | 9/2008 | Kobayashi | H01J 37/32935 156/345.25 |
| 2010/0065753 A1 * | 3/2010 | Enyama | H01J 37/1472 250/397 |
| 2011/0139983 A1 * | 6/2011 | Doi | H01J 37/244 250/307 |
| 2011/0163229 A1 * | 7/2011 | Frosien | H01J 37/05 250/310 |
| 2012/0037802 A1 * | 2/2012 | Kneedler | H01J 37/244 250/307 |
| 2013/0126730 A1 * | 5/2013 | Khursheed | H01J 3/26 250/307 |
| 2014/0124666 A1 * | 5/2014 | Sasaki | H01J 37/05 250/310 |
| 2014/0175277 A1 * | 6/2014 | Lanio | H01J 37/261 250/307 |
| 2016/0111251 A1 * | 4/2016 | Knippelmeyer | B82Y 10/00 250/398 |
| 2016/0268119 A1 * | 9/2016 | Nakagawa | H01J 37/224 |
| 2017/0213710 A1 * | 7/2017 | Vladimir | H04N 5/2252 |
| 2017/0221672 A1 * | 8/2017 | Kuroda | H01J 37/147 |
| 2017/0263415 A1 * | 9/2017 | Bizen | H01J 37/21 |
| 2017/0301512 A1 * | 10/2017 | Sekiguchi | H01J 37/244 |
| 2018/0082829 A1 * | 3/2018 | Muro | H01J 49/022 |

* cited by examiner

APPARATUS, METHOD AND SYSTEM FOR IMAGING AND UTILIZATION OF SEM CHARGED PARTICLES

RELATED APPLICATIONS

This application claims priority to U.S. Provisional Patent Application No. 62/678,011, filed on May 30, 2018, and entitled APPARATUS, METHOD AND SYSTEM FOR IMAGING AND UTILIZATION OF SEM CHARGED PARTICLES, the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Scanning electron microscopes (SEMs) are employed in connection with generating high-resolution nanoscale imagery of various objects. Conventionally, an SEM emits an electron beam toward a sample to stimulate emission of secondary, Auger, and backscattered electrons from the sample. In a conventional SEM, the emitted electrons are received at a detector that outputs an indication of a total number of electrons received at the detector for each position of the electron beam on the sample. Therefore, a conventional SEM is used in connection with generating an SEM image of the sample where a pixel value of the SEM image is based only upon the total number of electrons received at the detector for a given position of the electron beam on the sample. Conventionally, an SEM does not distinguish between electrons of different energies or emission angles from the sample.

Other SEMs have been devised that image the sample by selectively passing to the detector secondary electrons that lie in a single range of electron energies. In such an SEM, electrons emitted from the sample interact with a slit that is configured to pass only those electrons within a desired sampling range of energies. However, these slit-based SEMs are unable to distinguish between electrons in different energy ranges simultaneously, as the slit must be reconfigured in order to select a different range of electron energies.

SUMMARY

The following is a brief summary of subject matter that is described in greater detail herein. This summary is not intended to be limiting as to the scope of the claims.

Various technologies pertaining to multiplexed SEM imaging are described herein. With more specificity, an SEM imaging system is described herein that can be used in connection with generating an SEM image, wherein pixel values of the SEM image are based upon at least one of an energy of an electron or other charged particle emitted from a sample or an angle of emission of the species from the sample.

In an exemplary embodiment, the SEM imaging system comprises an SEM objective, one or more electron focusing elements (e.g., an electrostatic lens), a detector, and an imaging system. In the exemplary SEM imaging system, the SEM objective emits a beam of primary electrons toward a sample. The beam of primary electrons interacts with the sample to cause emission of secondary electrons and/or other charged particles from the sample. The electron focusing elements are configured to establish an electric field that accelerates the charged particles toward the detector. By way of example, a respective voltage is applied to each of the electron focusing elements in order to establish an electric field in the vicinity of the sample. The charged particles are emitted from the sample with a substantially conical distribution that is symmetric about the beam of primary electrons emitted by the SEM objective. The electron focusing elements and their respective applied voltages are configured to accelerate the charged particles toward the detector. In an embodiment, electron focusing elements accelerate the charged particles toward the detector such that the conical distribution of electrons about the primary electron beam is projected onto the surface of the detector. In the embodiment, electrons having a first energy strike a first location on the detector while electrons having a second energy strike a second location on the detector.

In various embodiments, an imaging system that comprises a computing device and an imaging device (e.g., a camera) can be configured to capture images of the detector and to generate SEM images of the sample based upon the captured images. In an example, the detector comprises a phosphor detector that emits light responsive to being struck by an electron. For each position of the primary electron beam on the sample, the imaging device captures an image of the phosphor detector. The image of the phosphor detector is indicative of locations where electrons impinged on the surface of the phosphor detector. The computing device computes an Abel transform based on the image of the phosphor detector to generate a representation of the conical distribution of the charged particles emitted from the sample. The representation is indicative of energies and emission angles of the charged particles emitted from the sample. Hence, for each position of the primary electron beam on the sample, the computing device generates SEM data indicative of energies and emission angles of the charged particles emitted from the sample. Based on the SEM data, the computing device can generate one or more SEM images that indicate surface features of the sample such as surface topography, composition, etc.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
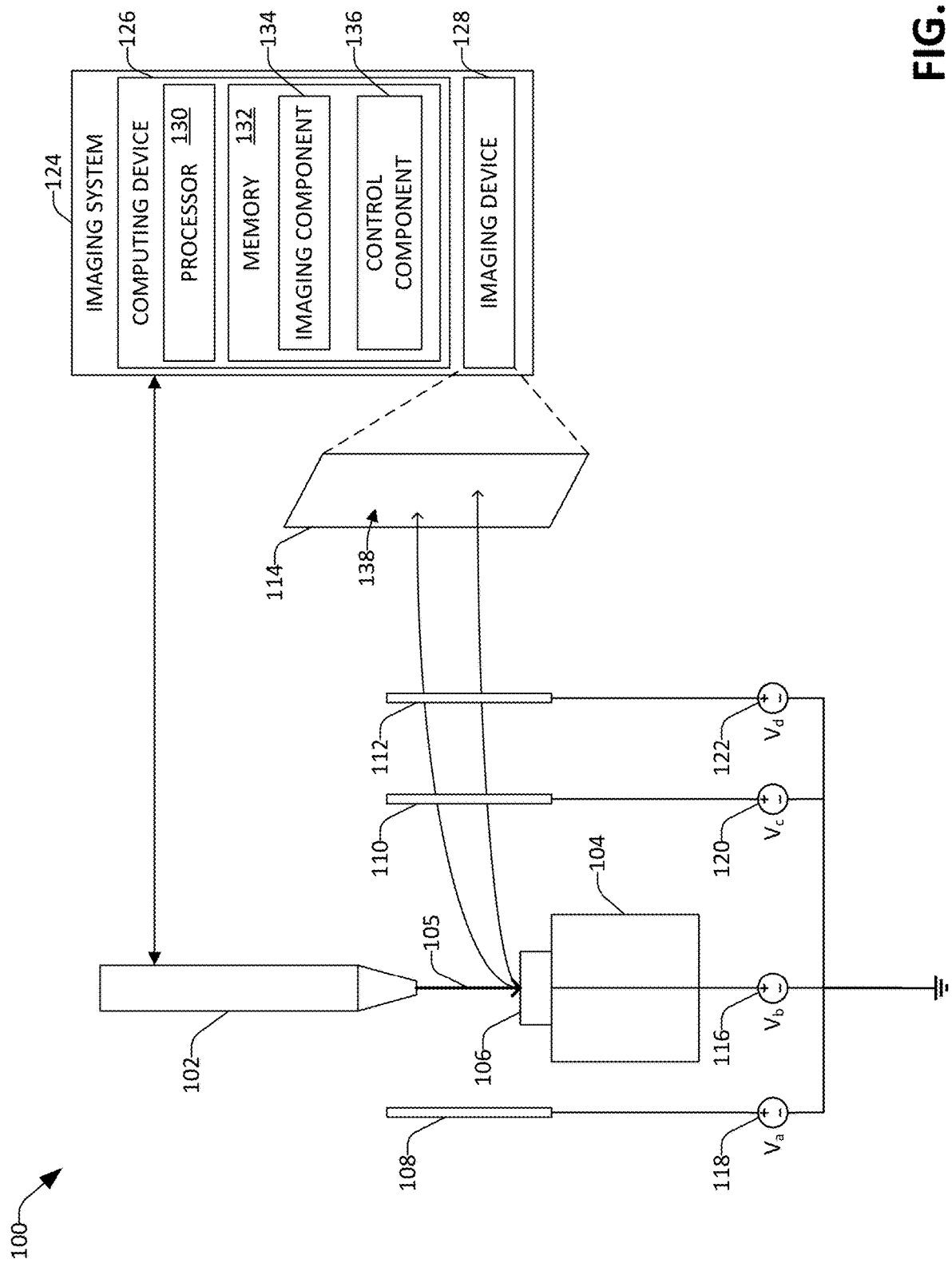
FIG. 1 is a conceptual diagram of an exemplary system that facilitates multiplexed SEM imaging.

Various technologies pertaining to multiplexed imaging are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference to FIG. 1, an exemplary system 100 that facilitates multiplexed SEM imaging is illustrated. The system 100 includes an SEM objective 102, a sample stage 104, and a sample 106 that is positioned on the sample stage 104. The SEM objective is positioned above the sample stage 104 and is configured to emit an electron beam 105 that impinges on the sample 106 and causes emission of charged particles (e.g., secondary electrons, Auger electrons, backscattered electrons, anions and/or cations) from the sample 106. The system 100 further comprises a plurality of electron focusing elements 108-112 that establish electric fields in the vicinity of the sample 106, and a detector 114 that outputs an indication of an electron or other charged particle striking the detector responsive to the electron or other charged particle impinging on the surface of the detector 114. The electron focusing elements 108-112 are positioned about the sample 106 such that electric fields established by the electron focusing elements 108-112 accelerate charged particles that are emitted from the sample 106 toward the detector 114. Still further, the system 100 includes voltage sources 116-122 that are connected to the sample stage 104 and the electron focusing elements 108-112, respectively.

The system 100 further includes an imaging system 124 that generates SEM data and images based upon output of the detector 114. The imaging system 124 comprises a computing device 126 and an imaging device 128. The computing device 126 comprises a processor 130 and memory 132 that is operably coupled to the processor 130. The memory 132 includes an imaging component 134 and a control component 136 that comprise executable instructions that are executed by the processor 130 in connection with generating SEM data and images of the sample 106. The imaging device 128 is positioned to capture images of the detector 114 during operation of the system 100.

Exemplary operations of the system 100 in connection with performing multiplexed SEM imaging are now described. The SEM objective 102 emits the beam of electrons 105, referred to as primary electrons, toward the sample 106. The beam 105 strikes the sample 106 and interacts with the sample 106 to cause emission of secondary electrons by the sample 106. Characteristics of the charged particles emitted by the sample 106 (e.g., energy of the particles, angles of emission of the particles, total number of the particles, etc.) are indicative of features of the sample 106. By way of example, an energy distribution of the charged particles emitted by the sample 106 can be indicative of a concentration of a dopant at the location of incidence of the electron beam 105 on the sample 106.

Figure 2B:
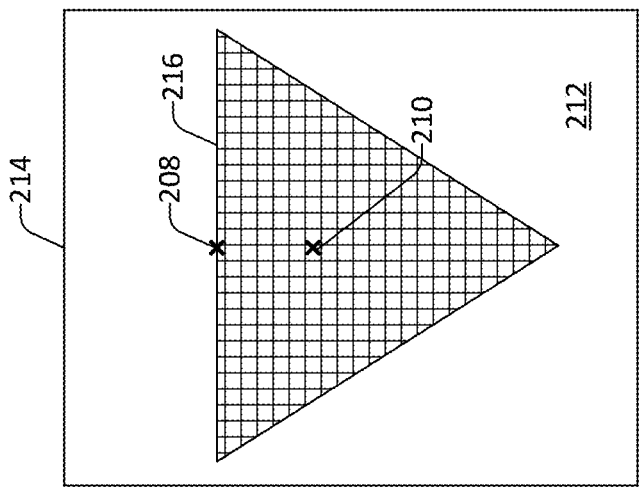
FIG. 2B is a diagram illustrating a projection of an electron distribution onto a two-dimensional detector.
Figure 2A:
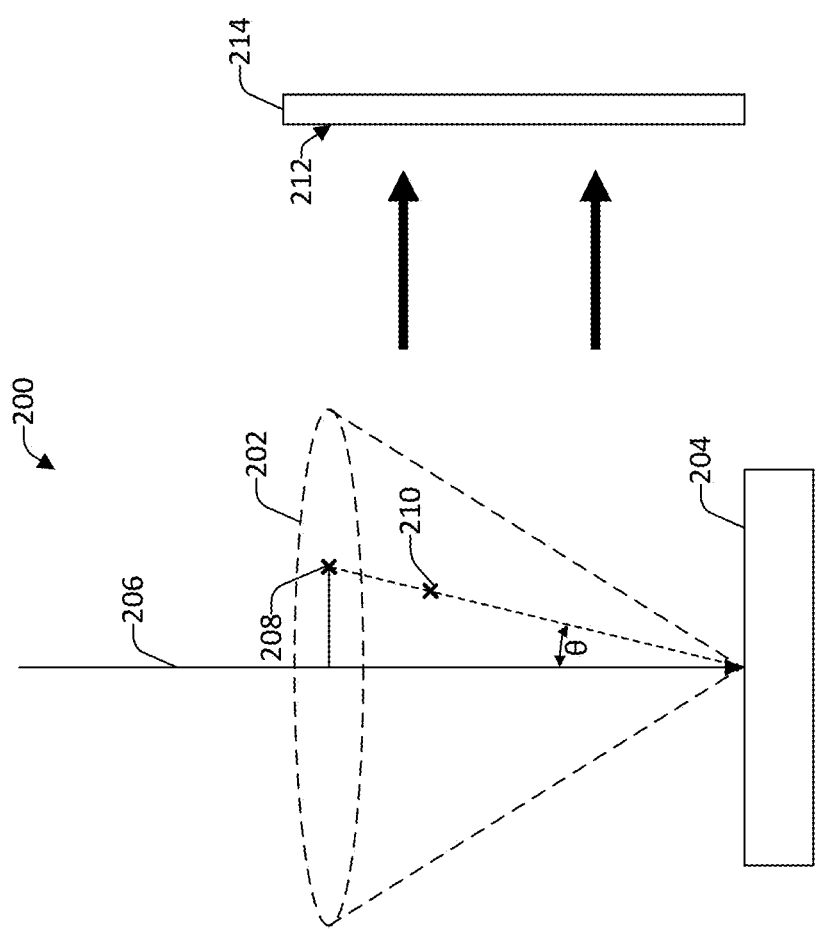
FIG. 2A is a diagram illustrating certain aspects pertaining to projection of a conical electron distribution onto a two-dimensional surface of a detector.

By way of example, and referring now to FIGS. 2A and 2B, conceptual diagrams are shown that illustrate a substantially conical distribution of charged particles and a projection of the conical distribution onto a two-dimensional detector surface. Referring now solely to FIG. 2A, a conceptual diagram 200 is shown that depicts a substantially conical distribution 202 of positions of charged particles emitted from a sample 204 at a time subsequent to impingement of an electron beam 206 on the sample 204. The conical distribution 202 depends on both kinetic energies and angles of emission of the charged particles emitted from the sample 204. For example, and as shown in FIG. 2A, at the point in time represented by the conical distribution 202, a first charged particle emitted from the sample 204 at an emission angle θ from the electron beam 206 and having a first kinetic energy is located at a first point 208. At the same point in time, a second charged particle emitted at the same emission angle θ has a second kinetic energy that is less than the first kinetic energy, and is located at a second point 210 that is below the first point 208. Within the conical distribution 202 of the charged particles emitted from the sample 204, a position of a particle is indicative of the kinetic energy of the particle and its angle of emission from the sample 204 relative to the electron beam 206.

The three-dimensional distribution of charged particles within the cone 202 is axially symmetric about the electron beam 206. While the distribution of charged particles within the cone 202 is difficult to measure directly, due to the axial symmetry of the cone 202 the three-dimensional distribution can be recovered from a projection of the distribution onto a two-dimensional plane. As shown in FIG. 2A, the cone 202 can be projected onto a two-dimensional surface 212 of a detector 214. Referring now to FIG. 2B, a view facing the surface 212 of the detector 214 is depicted. A two-dimensional projection 216 of the three-dimensional distribution of charged particles within the cone 202 is shown on the surface 212 of the detector 214. In the projection 216, the location 208 of the higher energy particle is projected at a higher position than the location 210 of the lower energy particle. Thus, for a same emission angle, particles of different energies are projected to different positions on the surface 212 of the detector 214. Similarly, for a same particle energy, particles with different emission angles are projected to different positions on the surface 212 of the detector 214.

Referring again to FIG. 1, upon emission from the sample 106, the charged particles are subjected to an electric field that is established by the electron focusing elements 108-112. The electron focusing elements 108-112 are configured such that the charged particles emitted from the sample 106 are accelerated toward the detector 114. The electric fields established by the electron focusing elements 108-112 accelerate the charged particles such that a three-dimensional spatial distribution of the charged particles is projected onto a two-dimensional surface 138 of the detector 114. In an exemplary embodiment, the electron focusing element 108 is positioned facing the sample 106 such that the electron focusing element 108 and the detector 114 are on opposite sides of the sample 106. In the embodiment, the electron focusing element 108 is configured such that charged particles emitted from the sample 106 are repulsed from the electron focusing element 108 and accelerated toward the detector 114. In additional embodiments, the electron focusing elements 110, 112 are positioned on a same side of the sample 106 as the detector 114. Still further, the electron focusing elements 110, 112 can be positioned in line with the sample 106 and the detector 114. In the additional embodiments, the electron focusing elements 110, 112 are configured to attract charged particles emitted from the sample 106, thereby accelerating the charged particles toward the detector 114.

The electric fields established by the electron focusing elements 108-112 are controlled by the voltage sources 118-122. For instance, the voltage source 118 is configured to apply a voltage $V_a$ such that a negative charge is established on the electron focusing element 108, thereby accelerating negatively charged secondary electrons away from the electron focusing element 108. In another example, the voltage sources 120, 122 can be configured to apply respective voltages $V_c$ and $V_d$ that establish positive charges on the electron focusing elements 110, 112, respectively. In such example, the positive charges on the electron focusing elements 110, 112 accelerate secondary electrons emitted from the sample 104 toward the detector 114. In various embodiments, the voltage source 116 can be configured to apply a voltage $V_b$ to the sample 106 in order to facilitate acceleration of charged particles away from the sample 106. In an exemplary embodiment, the voltage source 116 can be electrically coupled to an electrode on the sample stage 104, wherein the sample 106 makes electrical contact with the electrode when the sample 106 is positioned on the sample stage 104. In other embodiments, the voltage source 116 can be manually connected to the sample 106 directly.

Figure 3B:
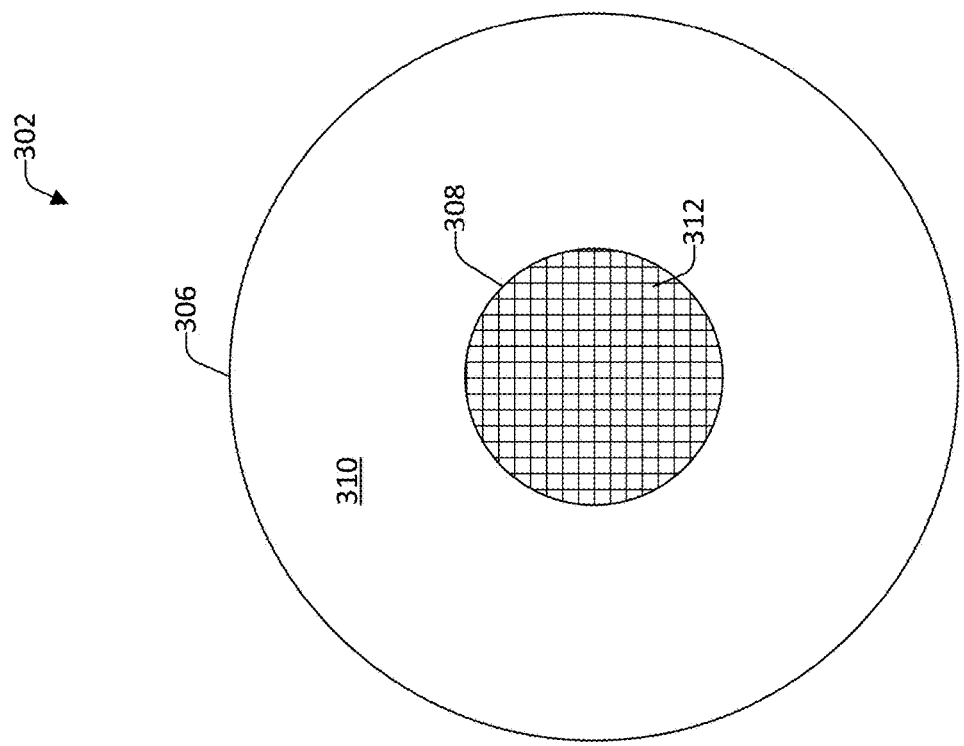
FIG. 3B is a diagram of another exemplary electron focusing element.
Figure 3A:
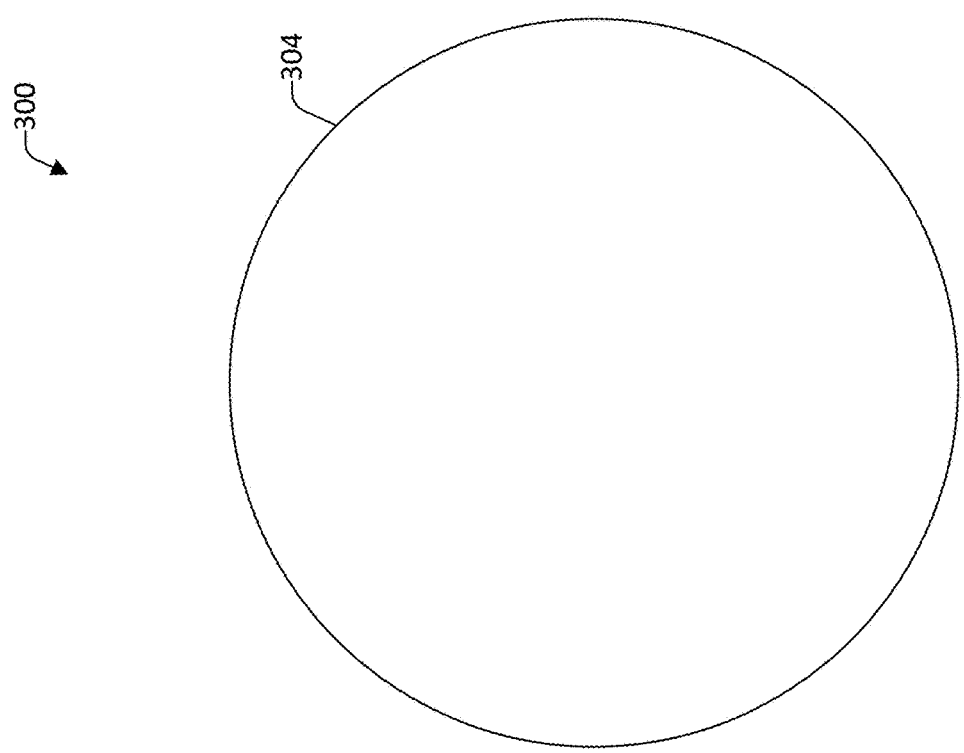
FIG. 3A is a diagram of an exemplary electron focusing element.

In exemplary embodiments, the electron focusing elements 108-112 comprise respective conductive plates. For example, and referring now to FIGS. 3A and 3B, exemplary electron focusing elements 300, 302 are shown. Referring now solely to FIG. 3A, the electron focusing element 300 comprises a solid circular conductive plate 304. The conductive plate 304 is suitable for use as the electron focusing element 108 in the system 100, which electron focusing element 108 repels charged particles in order to accelerate them toward the detector 114. Referring now solely to FIG. 3B, the electron focusing element 302 comprises a circular conductive plate 306, the plate 306 comprising an aperture 308. The electron focusing element 302 is suitable for use as either, or both, of the electron focusing elements 110, 112, as the electron focusing element 302 can be positioned so as to allow charged particles emitted from the sample 104 to pass through the aperture 308 and to the detector 114. By way of example, the electron focusing element 302 can be positioned between the sample 104 and the detector 114 such that a surface 310 of the plate 306 faces the sample 104 and a line-of-sight path exists between the sample 104 and the detector 114 through the aperture 308. In some embodiments, the electron focusing element 302 can further include a conductive mesh grating 312 that extends over the aperture 308. The mesh 312 can aid in flattening the electric field lines to improve the charged particle projection.

When a charged particle is incident on the detector 114, the detector 114 outputs an indication of the location of incidence of the charged particle on the detector 114. By way of an example, and not limitation, in an embodiment wherein the detector 114 comprises a phosphor element, the phosphor element emits light from a point at which a charged particle strikes the phosphor element, thereby indicating the location of incidence of the particle on the detector 114. As described in greater detail above with respect to FIGS. 2A and 2B, when charged particles emitted from the sample 106 are projected onto the surface 138 of the detector 114, a location of incidence of a charged particle is based upon its energy and angle of emission from the sample 106. Hence, the indication of a location of incidence of a charged particle output by the detector 114 comprises an indication of at least one of an energy or an angle of emission of the charged particle.

Figure 4:
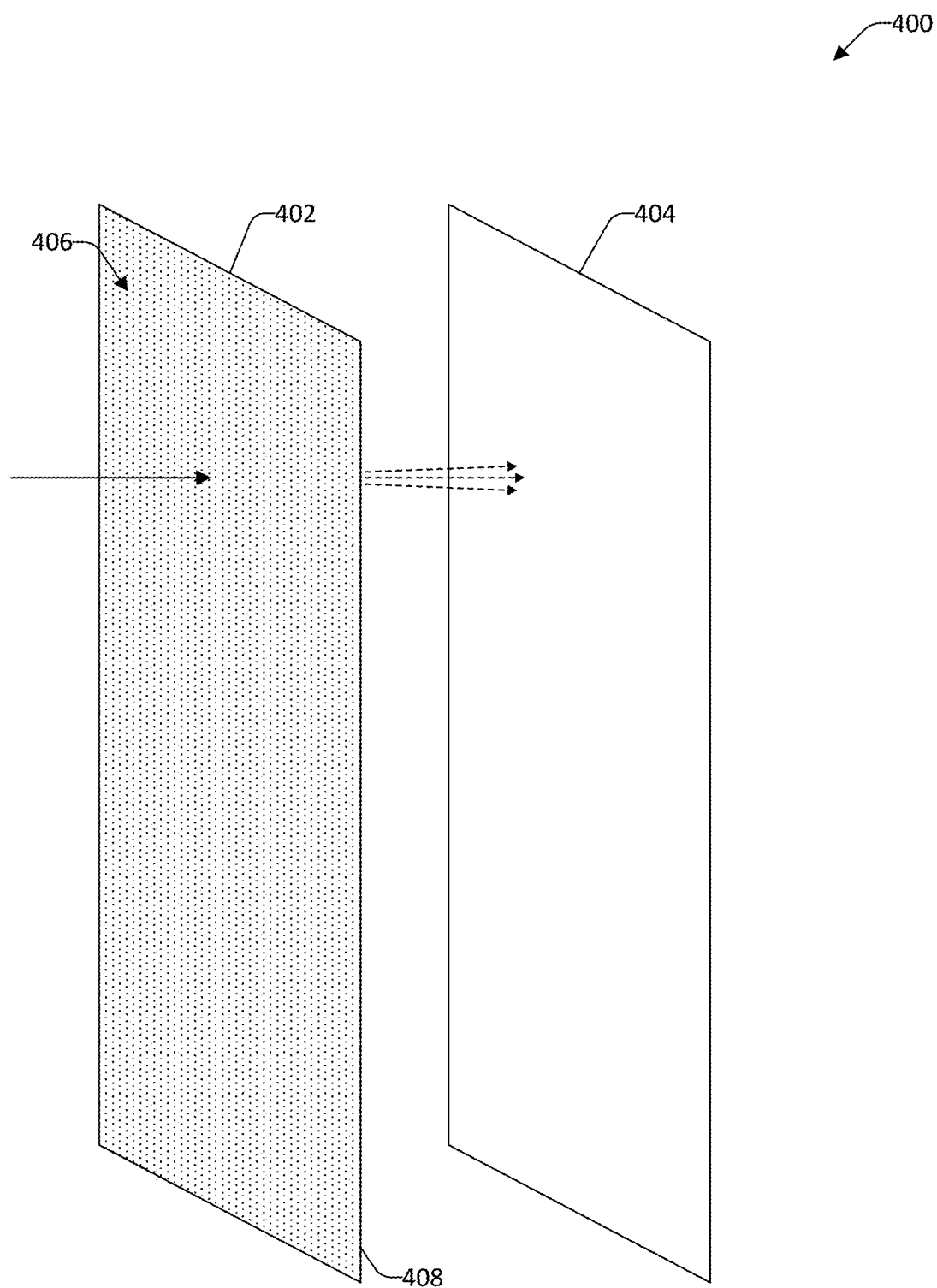
FIG. 4 is a diagram of an exemplary microchannel phosphor detector.

In some embodiments, the detector 114 is configured to amplify an effect caused by a charged particle being incident on the surface 138 of the detector 114. In an exemplary embodiment, the detector 114 comprises a microchannel phosphor detector. By way of example, and referring now to FIG. 4, an exemplary electron detector 400 is shown, the detector 400 comprising a microchannel plate 402 and a phosphor detector 404. The microchannel plate 402 is a resistive plate comprising a plurality of channels that extend from a front surface 406 to a back surface 408 of the microchannel plate 402. The channels are disposed within the microchannel plate 402 at an angle to the surfaces 406, 408. When a charged particle approaches the front surface 406 of the microchannel plate 402 and enters one of the channels, the particle interacts with the sides of the channel wall, causing emission of electrons inside the channel. Ultimately, a plurality of electrons exit the channel at the back surface 408 of the microchannel plate 402. The microchannel plate 402 and the phosphor detector 404 are arranged such that the electrons exiting the back surface 408 of the microchannel plate 402 impinge on the phosphor detector 404, causing the phosphor detector 404 to emit light. The microchannel plate 402 and the phosphor detector 404 are aligned such that a location of incidence of electrons on the phosphor detector 404 (e.g., electrons having exited the back surface 408 of the microchannel plate 402) is indicative of a location of incidence of a charged particle at the front surface 406 of the microchannel plate 402.

In an exemplary embodiment wherein the detector 114 comprises a microchannel phosphor detector, a charged particle strikes the surface of a hole in the microchannel plate causing the emission of electrons from the hole's sidewall. These electrons proceed to cascade through the hole, increasing in number, until finally striking a phosphor detector, causing the phosphor detector to emit light at a location on the phosphor detector that corresponds to the location of the hole in the microchannel plate initially struck by the charged particle. The signal location on the phosphor detector is indicative of the location of incidence of the charged particle at the microchannel plate. Since the initial location of incidence of the charged particles on the detector 114 is indicative of the energy and angle of emission of the charged particle, the light emitted from the phosphor detector of the microchannel plate is indicative of at least one of an energy or angle of emission of the charged particle. While certain detailed aspects have been set forth with respect to a microchannel plate detector, is it to be understood that the detector 114 may be or include other types of detectors that are capable of indicating a spatial location of incidence of a charged particle on the surface of the detector 114.

The imaging system 124 is configured to receive or capture data from the detector 114 and to generate data or images indicative of features of the sample 104. By way of example, the imaging system 124 can be configured to generate an image of surface topography of the sample 104. In another example, the imaging system 124 can be configured to generate an image wherein pixel values of the image are indicative of energies of charged particles emitted from the sample 104 at different locations of incidence of the electron beam 105 on the sample 104.

In an exemplary embodiment the detector 114 emits light responsive to a charged particle being incident on the detector 114. In the embodiment, the imaging device 128 of the imaging system 124 captures an image of the detector 114. The image of the detector 114 captured by the imaging device 128 is indicative of locations on the detector 114 that were struck by charged particles. Hence, the image of the detector 114 captured by the imaging device 128 can be used to generate data indicating energies and emission angles of charged particles that struck the detector 114, as described in greater detail above. In an example, the imaging component 134 performs an Abel transform over the image captured by the imaging device 128 in order to recover the spatial distribution of charged particles about the electron beam 105 at a given time, which distribution pattern is axially symmetric about the beam 105. Based on the Abel transform of the image of the detector 114, the imaging component 134 outputs emissions data indicative of the energies and emission angles of charged particles emitted from the sample 106 when the beam 105 is incident on a single point on the sample 106. From the emissions data, the computing device 126 can generate sample data that is indicative of one or more features or characteristics of the sample 106 at the point on the surface of the sample 106 that is illuminated by the electron beam 105.

It is to be appreciated from the foregoing that, in contrast to a conventional SEM, the SEM imaging system 100 measures many bands of particle energies and emission angles simultaneously, without requiring reconfiguration of the components of the system 100. For instance, the distribution pattern of the charged particles about the electron beam 105 that is recovered by way of the Abel transform, as described above, indicates a total energy of charged particles emitted from the sample 106 for substantially any range of electron energies. Stated differently, the SEM imaging system 100 is a "single-pass" system, wherein data pertaining to many different charged particle energy bands is captured in a single pass of illuminating the sample 106 by way of the electron beam 105 and receiving the emitted charged particles at the detector 114. In an embodiment, the SEM imaging system 100 measures particle energies ranging from zero electron volts (eV) to 200 eV. In another embodiment, SEM imaging system 100 measures particle energies up to 1000 eV.

In various embodiments, the computing device 126 generates an SEM image based at least in part on a captured image of the detector 114. By way of example, the control component 136 is configured to control the SEM objective 102 to scan the electron beam 105 across a surface of the sample 106. For each of a plurality of points of incidence of the beam 105 on the sample 106, the imaging device 128 captures an image of the detector 114. The image of the detector 114 captured by the imaging device 128 is indicative of locations on the detector 114 that were struck by charged particles when the electron beam 105 was striking the sample 106 at a particular point. Therefore, as the control component 136 causes the SEM objective 102 to scan the electron beam 105 across the surface of the sample 106, the imaging device 128 captures a plurality of images of the detector 114. Collectively, these images are indicative of where charged particles struck the detector 114 at each point of the electron beam 105 on the sample 106. The imaging component 134 executes a respective Abel transform over each of the images of the detector 114 captured by the imaging device 128. From the Abel transforms, the imaging component 134 generates respective emissions data indicative of charged particle energies and emission angles for each of the plurality of points of incidence of the beam 105 on the sample 106.

The imaging component 134 can generate an SEM image of the surface of the sample 106 based on the emissions data. In an example, the imaging component 134 generates an SEM image of the surface of the sample 106 wherein a pixel value of the SEM image is based upon the emissions data pertaining to the corresponding point on the sample 106. In the example, the pixel values of the SEM image are indicative of values of a feature or characteristic of the sample 106 at each of a plurality of locations on the surface of the sample 106. For instance, the pixel values of an SEM image generated by the imaging component 134 in accordance with the technologies set forth herein can be indicative of total energy of charged particles emitted from the sample 106 in a specified range of particle energies.

While one exemplary arrangement of the electron focusing elements 108-112 is depicted in FIG. 1, it is to be understood that other arrangements of electron focusing elements are contemplated as being within the scope of the present disclosure. For instance, a smaller or larger number of electron focusing elements could be used to project the three-dimensional distribution of charged particles onto the detector 114. Further, while exemplary electron focusing elements 300, 302 are depicted in FIGS. 3A and 3B, respectively, it is to be understood that other types of electron focusing elements may be used to accelerate the charged particles toward the detector 114.

Figure 5:
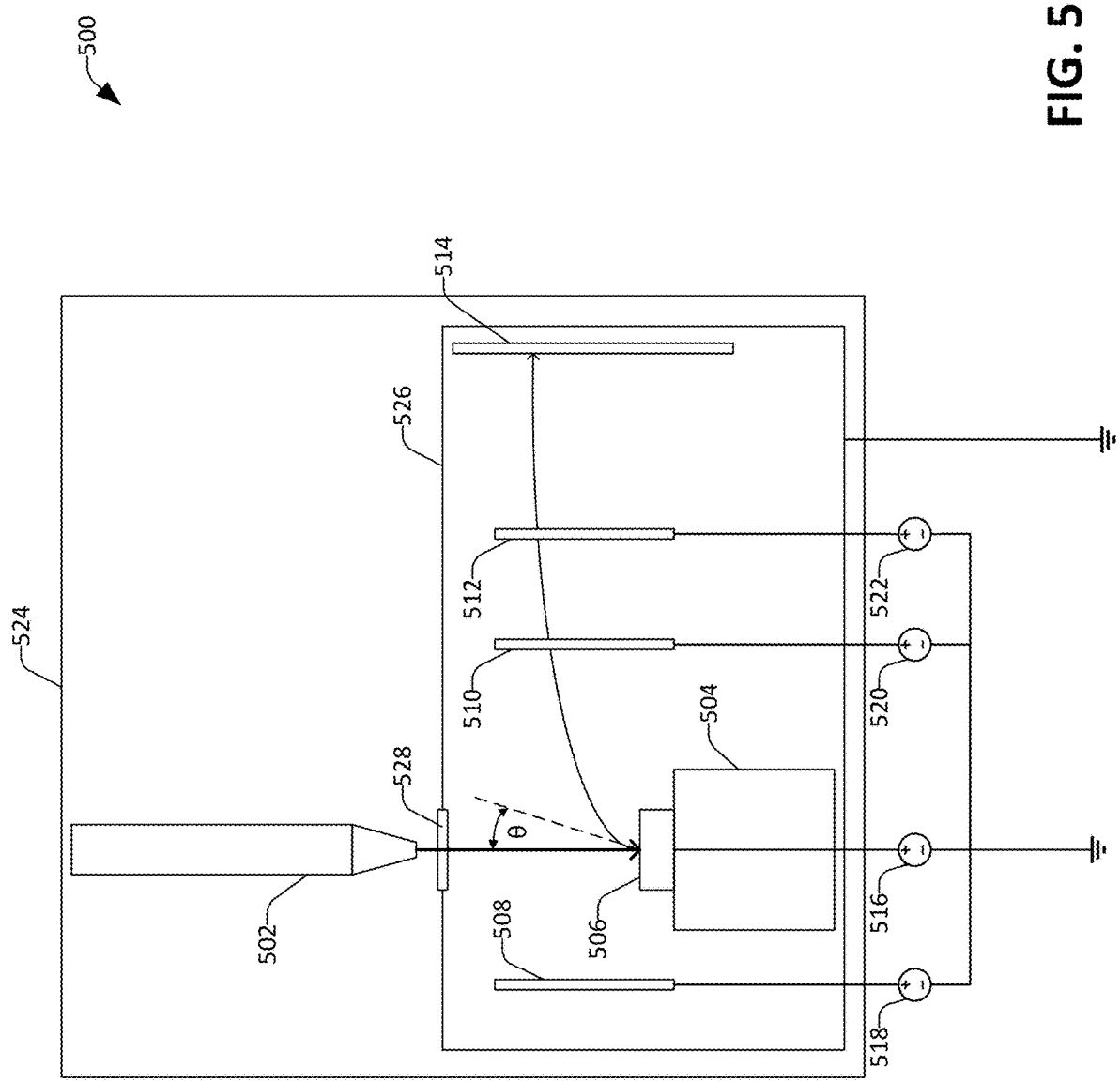
FIG. 5 is a diagram of an exemplary SEM system that includes a vacuum chamber and a magnetic shielding element.

It is to be understood that aspects of the SEM system 100 described herein above may be adapted to a variety of different configurations and combinations with other elements. In an exemplary embodiment, and referring now to FIG. 5, an exemplary SEM system 500 is illustrated, wherein various components of an SEM system are enclosed by a vacuum chamber and/or magnetic shielding. The system 500 includes an SEM objective 502, a sample stage 504 that holds a sample 506, electron focusing elements 508-512, a detector 514, and voltage sources 516-522 connected to the sample stage 504 and electron focusing elements 508-512, respectively. In the exemplary system 500, the SEM objective 502, the sample stage 504 and sample 506, the electron focusing elements 508-512, and the detector 514 are positioned within a vacuum chamber 524. Still further, the system 500 comprises a magnetic shield 526, wherein the sample stage 504 (with sample 506), the electron focusing elements 508-512, and the detector 514 are positioned within the magnetic shield 526. The magnetic shield 526 can include an aperture 528 through which an electron beam 530 is emitted by the SEM objective 502. The magnetic shield 526 shields charged particles emitted from the sample 506 from magnetic fields that could otherwise exert forces on the charged particles, causing a distortion of the electron distribution received at the detector 514. The magnetic shield 526 can further be electrically grounded, thereby shielding the charged particles from electric fields other than those established by the electron focusing elements 508-512. In exemplary embodiments, the magnetic shield 526 comprises a nickel-iron alloy, commonly called mu-metal.

Figure 6:
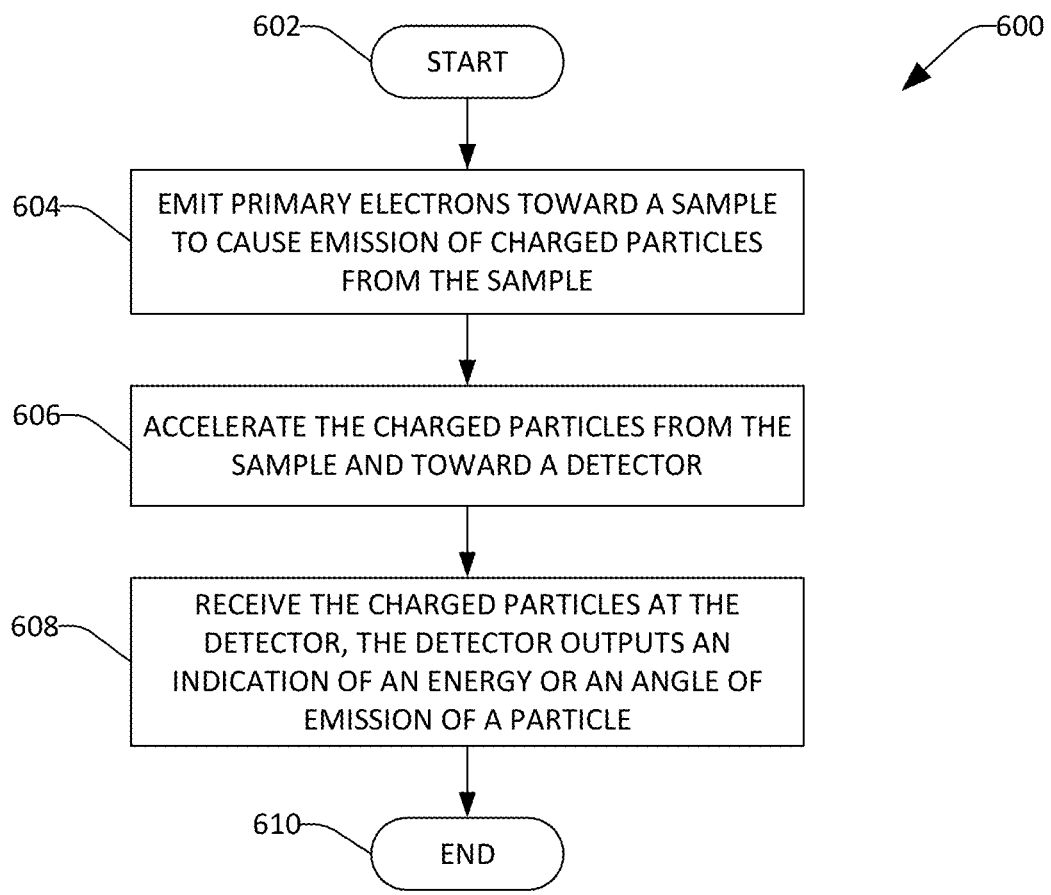
FIG. 6 is a flow diagram that illustrates an exemplary methodology for multiplexed SEM imaging.

FIG. 6 illustrates an exemplary methodology relating to full-spectrum SEM imaging. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, various acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodologies can be stored in a computer-readable medium, displayed on a display device, and/or the like.

Referring now to FIG. 6, a methodology 600 that facilitates full spectrum SEM imaging is illustrated. The methodology 600 begins at 602, and at 604 primary electrons are emitted toward a sample to cause emission of charged particles from the sample. For example, and as described above, a beam of electrons can be emitted toward the sample by an SEM objective. At 606, the charged particles emitted from the sample are accelerated away from the sample and toward a detector. In exemplary embodiments, the detector comprises a two-dimensional surface, wherein the detector is configured to output an indication of a location of incidence of a charged particle on the two-dimensional surface responsive to the charged particle striking the surface. By way of example, the detector can be or include a microchannel phosphor detector. At 608, the charged particles emitted from the sample are received at the detector, whereupon the detector outputs an indication of at least one of an energy or an angle of emission of a particle in the charged particles. For instance, and as set forth in greater detail above, the location of incidence of a charged particle on a surface of the detector can be indicative of an energy and an angle of emission of the charged particle. The methodology 600 completes at 610.

Figure 7:
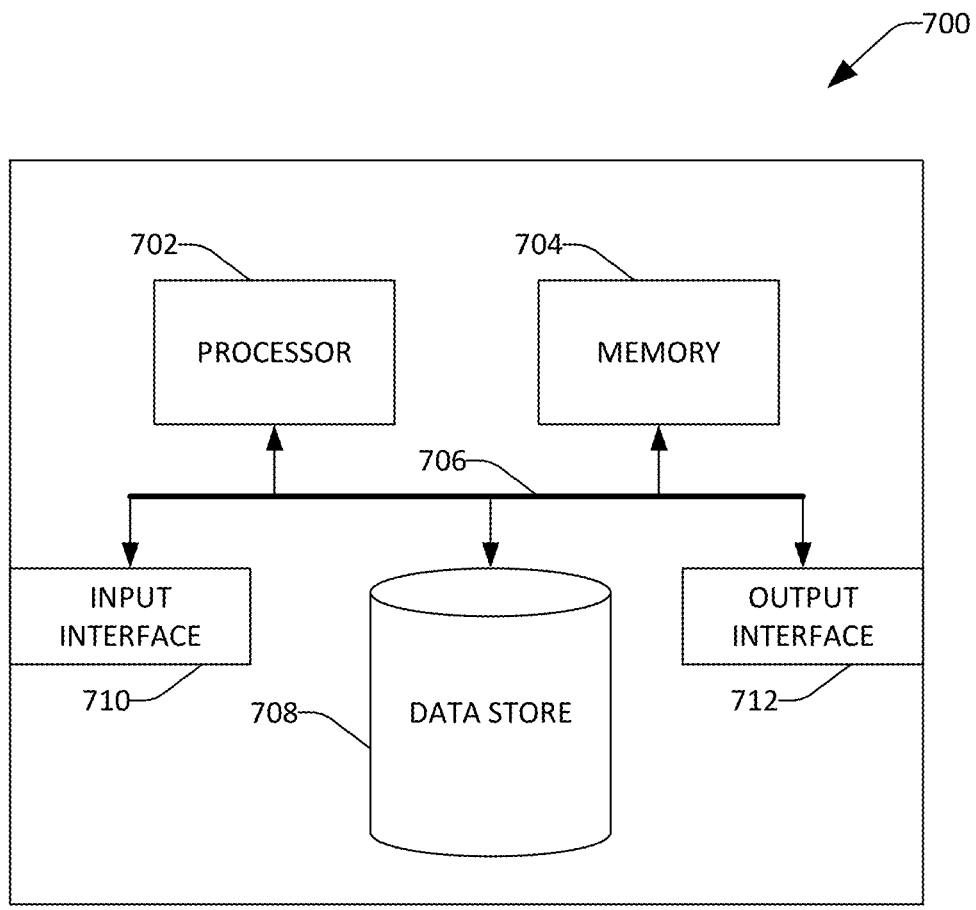
FIG. 7 is an exemplary computing system.

Referring now to FIG. 7, a high-level illustration of an exemplary computing device 700 that can be used in accordance with the systems and methodologies disclosed herein is illustrated. For instance, the computing device 700 may be used in a system that facilitates generation of SEM images based upon output of a detector, as described herein. By way of another example, the computing device 700 can be used in a system that controls emission of an electron beam from an SEM objective. The computing device 700 includes at least one processor 702 that executes instructions that are stored in a memory 704. The instructions may be, for instance, instructions for implementing functionality described as being carried out by one or more components discussed above or instructions for implementing one or more of the methods described above. The processor 702 may access the memory 704 by way of a system bus 706. In addition to storing executable instructions, the memory 704 may also store images of a detector, SEM images, emissions data, etc.

The computing device 700 additionally includes a data store 708 that is accessible by the processor 702 by way of the system bus 706. The data store 708 may include executable instructions, SEM images, image of a detector, emissions data, etc. The computing device 700 also includes an input interface 710 that allows external devices to communicate with the computing device 700. For instance, the input interface 710 may be used to receive instructions from an external computer device, from a user, etc. The computing device 700 also includes an output interface 712 that interfaces the computing device 700 with one or more external devices. For example, the computing device 700 may display text, images, etc. by way of the output interface 712.

Additionally, while illustrated as a single system, it is to be understood that the computing device 700 may be a distributed system. Thus, for instance, several devices may be in communication by way of a network connection and may collectively perform tasks described as being performed by the computing device 700.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A scanning electron microscope (SEM) system, comprising:
    an electron source that emits a beam of primary electrons toward a sample such that the primary electrons being incident on the sample causes emission of charged particles from the sample;
    an electron focusing element that is configured to accelerate the charged particles away from the sample;
    a detector positioned such that the electron focusing element accelerates the charged particles toward a surface of the detector such that the charged particles are projected onto the surface of the detector according to a distribution of the charged particles about the beam of primary electrons, wherein responsive to a charged particle in the charged particles being incident on the surface of the detector, the detector emits light indicative of a location at which the charged particle struck the surface of the detector, the location being indicative of at least one of an energy or an angle of emission of the charged particle;
    an imaging system that outputs an image of the detector; and
    a computing system that receives the image of the detector from the imaging system and computes an Abel transform based upon the image, wherein the Abel transform is indicative of the distribution of the charged particles about the beam of primary electrons, and wherein the computing system outputs data indicative of the energy and the angle of emission of the charged particle based upon the Abel transform.

2. The SEM system of claim 1, wherein the electron focusing element is a first electron focusing element, the system further comprising a second electron focusing element that receives the charged particles from the first electron focusing element and accelerates the charged particles toward the surface of the detector.

3. The SEM system of claim 2, further comprising a third electron focusing element positioned such that the sample is between the third electron focusing element and the first electron focusing element, the third electron focusing element configured to accelerate the charged particles toward the first electron focusing element.

4. The SEM system of claim 3, further comprising a voltage source that is configured to apply a voltage to at least one of the first electron focusing element, the second electron focusing element, and the third electron focusing element.

5. The SEM system of claim 1, wherein the electron focusing element comprises a conductive plate, the conductive plate having a voltage applied thereto.

6. The SEM system of claim 5, the conductive plate comprising an aperture, wherein the charged particles are accelerated through the aperture and toward the detector.

7. The SEM system of claim 6, wherein the electron focusing element further comprises a conductive mesh that extends over the aperture.

8. The SEM system of claim 1, wherein the electron focusing element accelerates the charged particles toward the surface of the detector such that a first position at which a first charged particle in the charged particles is incident on the surface of the detector is indicative of at least one of an energy of the first charged particle or an angle of emission of the first charged particle from the sample, and such that a second charged particle being incident on the surface of the detector at a second position is indicative of at least one of an energy of the second charged particle or an angle of emission of the second charged particle from the sample being different from the energy of the first charged particle or the angle of emission of the first charged particle.

9. The SEM system of claim 1, wherein the detector comprises:
    a microchannel plate; and
    a phosphor detector, wherein the charged particle in the charged particles being incident on the microchannel plate causes emission of electrons, the electrons being incident on the phosphor detector causing the phosphor detector to output the indication of at least one of the energy or the angle of emission of the charged particle in the charged particles.

10. The SEM system of claim 1, further comprising a magnetic shielding element that encloses the sample, the electron focusing element, and the detector.

11. The SEM system of claim 10, wherein the magnetic shielding element is composed of a nickel-iron alloy.

12. The SEM system of claim 1, wherein the computing device outputs an SEM image of the sample, wherein a value of a pixel of the SEM image is based upon the energy and the emission angle of the charged particle.

13. The SEM system of claim 1, further comprising a vacuum chamber, wherein the sample, the electron focusing element, and the detector are positioned within the vacuum chamber.

14. The SEM system of claim 1, further comprising a sample stage, wherein the sample stage is configured to apply a voltage to the sample.

15. A method, comprising:
    emitting primary electrons toward a sample such that the primary electrons being incident on the sample causes emission of charged particles from the sample;
    accelerating the charged particles from the sample and toward a surface of a detector by way of an electron focusing element, such that the charged particles are projected onto the surface of the detector according to a distribution of the charged particles about a direction of emission of the primary electrons; and
    receiving the charged particles at the surface of the detector, wherein responsive to a charged particle in the charged particles being incident on the surface of the detector, the detector emits light indicative of a location at which the charged particle struck the surface of the detector;

capturing an image of the detector by way of a camera;

computing, by way of a computing system, an Abel transform based upon the image of the detector, wherein the Abel transform is indicative of the distribution of the charged particles about the direction of emission of the primary electrons; and outputting, by way of the computing system, data indicative of an energy and an angle of emission of the charged particle based upon the Abel transform.

16. The method of claim 15, wherein the detector comprises a microchannel phosphor detector.

17. The method of claim 15, further comprising:

outputting, by way of the computing device and based upon the Abel transform, an SEM image of the sample, a pixel value of the SEM image indicative of a feature of the sample and based upon at least one of the energy or the angle of emission of the charged particle.

18. A scanning electron microscope (SEM) system, comprising:

an electron source that emits primary electrons toward a sample such that the primary electrons being incident on the sample causes emission of charged particles from the sample;

an electron focusing element that is configured to accelerate the charged particles away from the sample;

a detector positioned such that the electron focusing element accelerates the charged particles toward the detector in a manner such that the charged particles are projected onto a surface of the detector according to a conical distribution of the charged particles about a direction of emission of the primary electrons, wherein responsive to a charged particle in the charged particles being incident on the detector, the detector outputs an indication of a location of incidence of the charged particle on the detector;

a camera that outputs an image of the detector; and a computing device that receives the image of the detector from the camera computes an Abel transform based upon the image of the detector, wherein the Abel transform is indicative of the conical distribution of the charged particles about the direction of emission of the primary electrons, wherein further the computing device outputs data indicative of an energy and angle of emission from the sample of a first charged particle in the charged particles based upon the Abel transform.

19. The SEM system of claim 18, the detector comprising a microchannel phosphor detector.

\* \* \* \* \*